(12) United States Patent  (10) Patent No.: US 7,611,954 B2
Freeman et al.                (45) Date of Patent:    Nov. 3, 2009

(54) BIPOLAR TRANSISTOR SELF-ALIGNMENT WITH RAISED EXTRINSIC BASE EXTENSION AND METHODS OF FORMING SAME

(75) Inventors: Gregory G. Freeman, Hopewell Junction, NY (US); Marwan H. Khater, Long Island City, NY (US); Francois Pagette, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 652 days.

(21) Appl. No.: 11/150,894

(22) Filed: Jun. 13, 2005

(65) Prior Publication Data

US 2005/0233535 A1     Oct. 20, 2005

Related U.S. Application Data

(62) Division of application No. 10/604,212, filed on Jul. 1, 2003, now Pat. No. 6,960,820.

(51) Int. Cl.
*H01L 21/8222* (2006.01)
(52) U.S. Cl. ............... 438/321; 438/349; 257/E21.379; 257/E21.507
(58) Field of Classification Search .................. 438/321, 438/339, 349, 364, 320, 926
See application file for complete search history.

(56) References Cited

U.S. PATENT DOCUMENTS

| 5,128,271 | A | | 7/1992 | Bronner et al. |
| 5,391,503 | A | * | 2/1995 | Miwa et al. ................. 438/349 |
| 5,494,836 | A | | 2/1996 | Imai |
| 5,506,427 | A | | 4/1996 | Imai |
| 5,599,723 | A | | 2/1997 | Sato |
| 5,648,280 | A | | 7/1997 | Kato |

(Continued)

FOREIGN PATENT DOCUMENTS

JP     61269374     11/1986

(Continued)

*Primary Examiner*—Alexander G Ghyka
*Assistant Examiner*—Reema Patel
(74) *Attorney, Agent, or Firm*—Lisa Jaklitsch; Hoffman Warnick LLC

(57) ABSTRACT

A self-aligned bipolar transistor structure having a raised extrinsic base comprising an outer region and an inner region of different doping concentrations and methods of fabricating the transistor are disclosed. More specifically, the self-alignment of the extrinsic base to the emitter is accomplished by forming the extrinsic base in two regions. First, a first material of silicon or polysilicon having a first doping concentration is provided to form an outer extrinsic base region. Then a first opening is formed in the first material layer by lithography within which a dummy emitter pedestal is formed, which results in forming a trench between the sidewall of the first opening and the dummy pedestal. A second material of a second doping concentration is then provided inside the trench forming a distinct inner extrinsic base extension region to self-align the raised extrinsic base edge to the dummy pedestal edge. Since the emitter is formed where the dummy pedestal existed, the extrinsic base is also self-aligned to the emitter. The silicon or polysilicon forming the inner extrinsic base extension region can also be grown in the trench with selective or non-selective epitaxy.

11 Claims, 18 Drawing Sheets

U.S. PATENT DOCUMENTS

| | | | |
|---|---|---|---|
| 5,656,514 A | 8/1997 | Ahlgren et al. | |
| 5,668,396 A | 9/1997 | Sato | |
| 5,721,147 A * | 2/1998 | Yoon | 438/367 |
| 5,723,378 A | 3/1998 | Sato | |
| 5,766,999 A | 6/1998 | Sato | |
| 5,789,800 A | 8/1998 | Kohno | |
| 5,798,561 A | 8/1998 | Sato | |
| 5,821,149 A | 10/1998 | Schuppen et al. | |
| 5,834,800 A | 11/1998 | Jalali-Farahani et al. | |
| 5,846,869 A | 12/1998 | Hashimoto et al. | |
| 5,962,880 A * | 10/1999 | Oda et al. | 257/198 |
| 6,121,101 A | 9/2000 | King et al. | |
| 6,281,097 B1 | 8/2001 | Aoyama | |
| 6,287,929 B1 | 9/2001 | Kato | |
| 6,329,698 B1 | 12/2001 | Koscielniak et al. | |
| 6,337,251 B1 | 1/2002 | Hashimoto | |
| 6,346,453 B1 | 2/2002 | Kovacic et al. | |
| 6,380,017 B1 | 4/2002 | Darwish et al. | |
| 6,383,855 B1 | 5/2002 | Gao et al. | |
| 6,388,307 B1 | 5/2002 | Kondo et al. | |
| 6,404,039 B1 | 6/2002 | Fujii | |
| 6,461,888 B1 * | 10/2002 | Sridhar et al. | 438/52 |
| 6,465,870 B2 | 10/2002 | Voldman | |
| 6,475,848 B1 | 11/2002 | Darwish et al. | |
| 6,603,188 B1 | 8/2003 | Darwish et al. | |
| 6,828,602 B2 | 12/2004 | Asai et al. | |
| 2005/0082642 A1 | 4/2005 | Freeman et al. | |

FOREIGN PATENT DOCUMENTS

| | | |
|---|---|---|
| JP | 64053454 | 3/1989 |
| JP | 6124956 | 5/1994 |
| JP | 2002270615 | 9/2002 |
| JP | 2002313799 | 10/2002 |

* cited by examiner

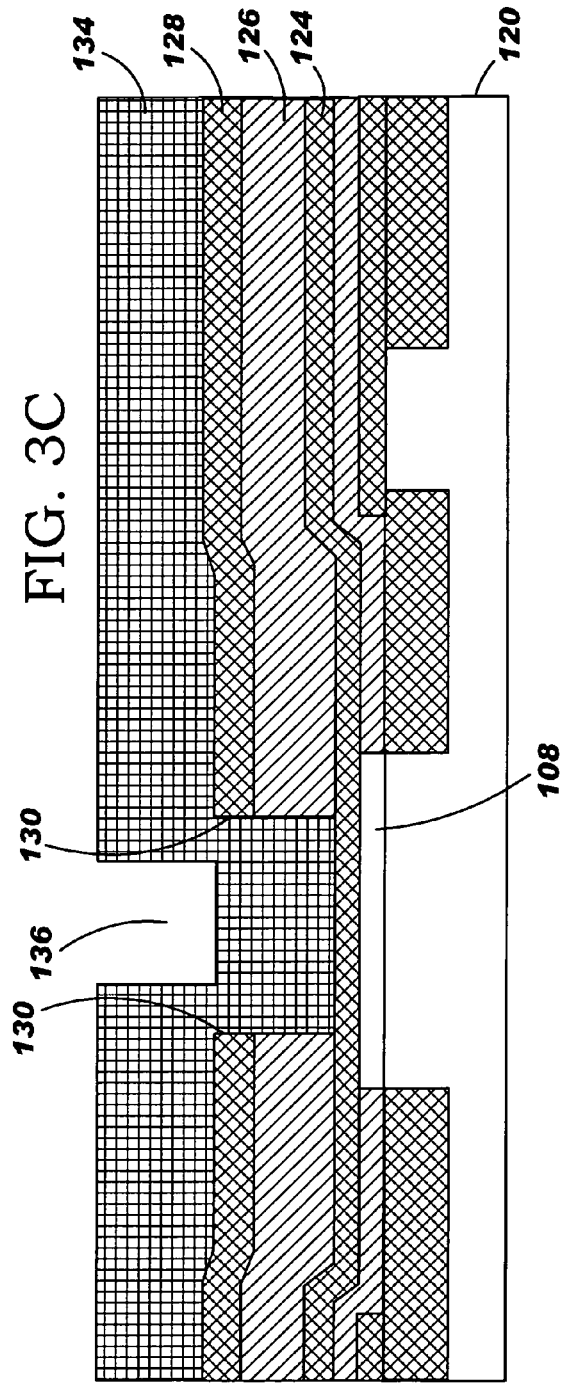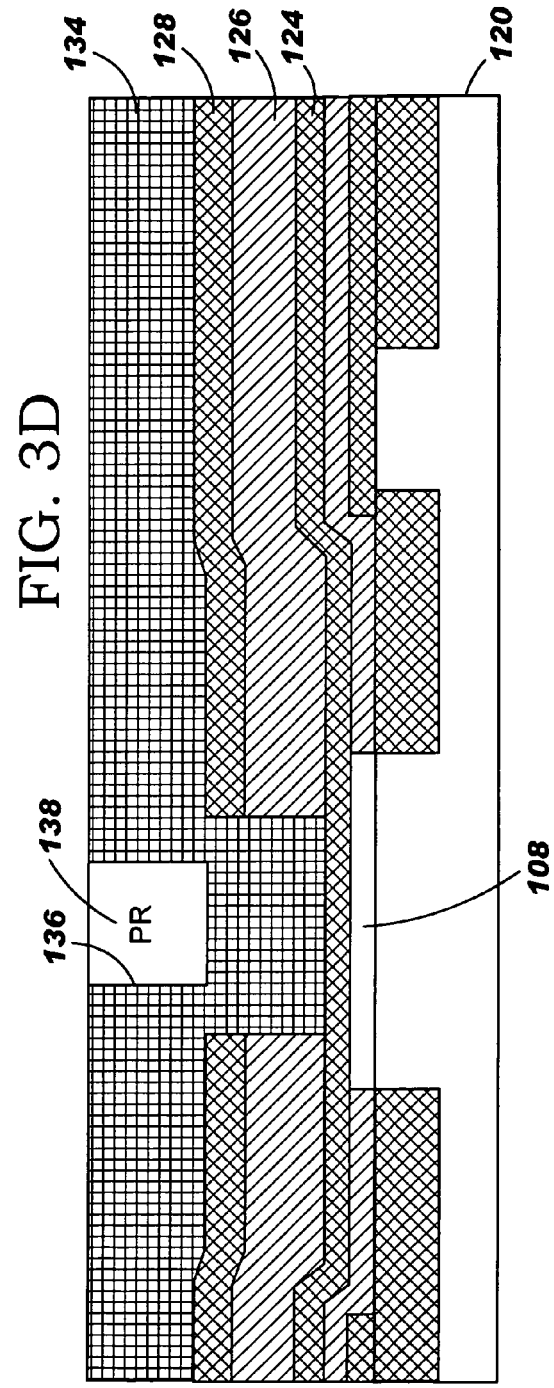

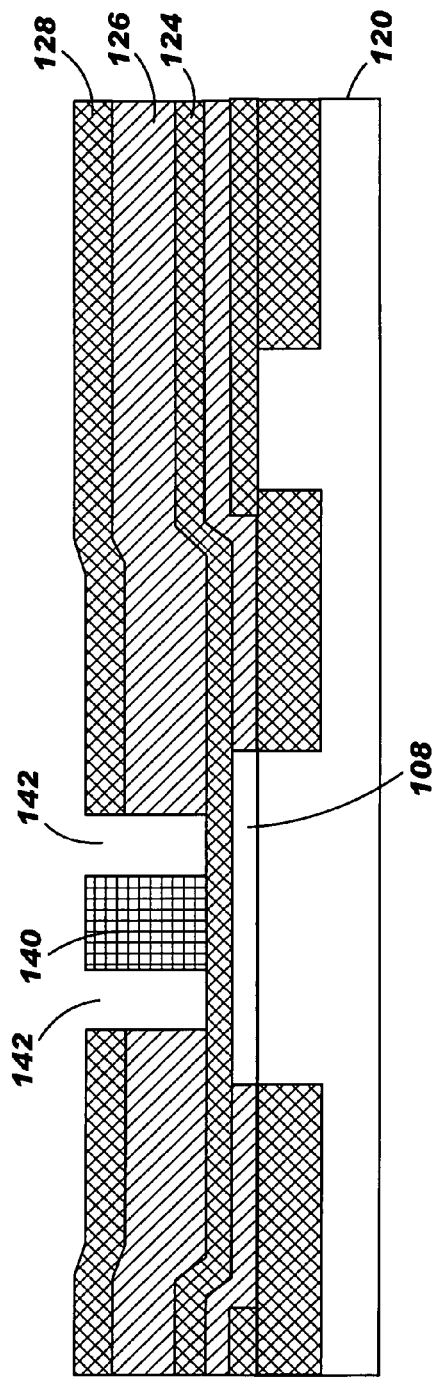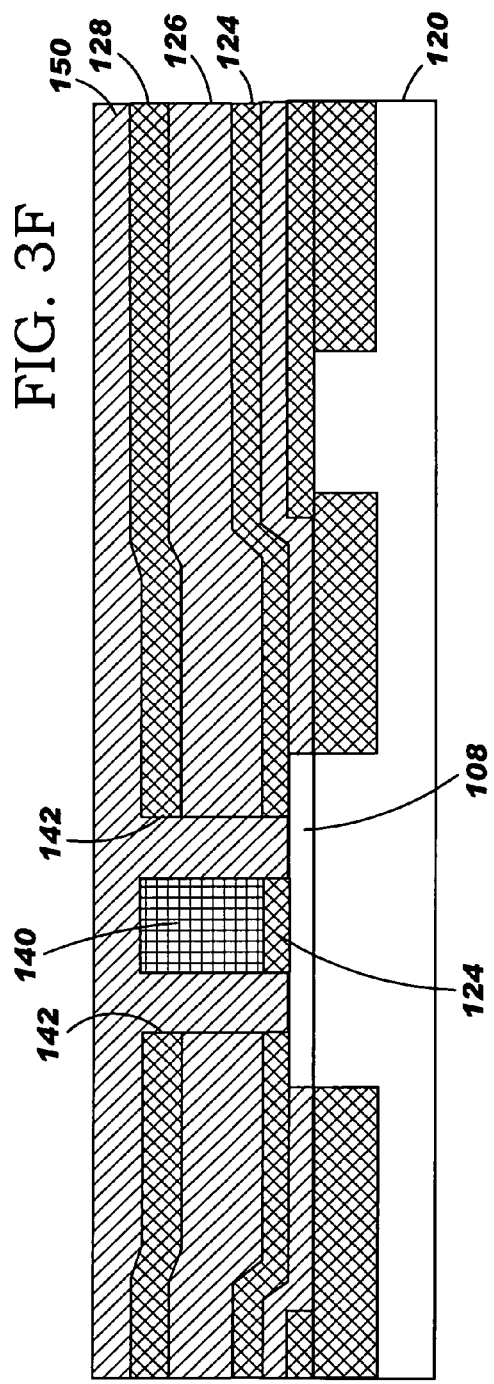

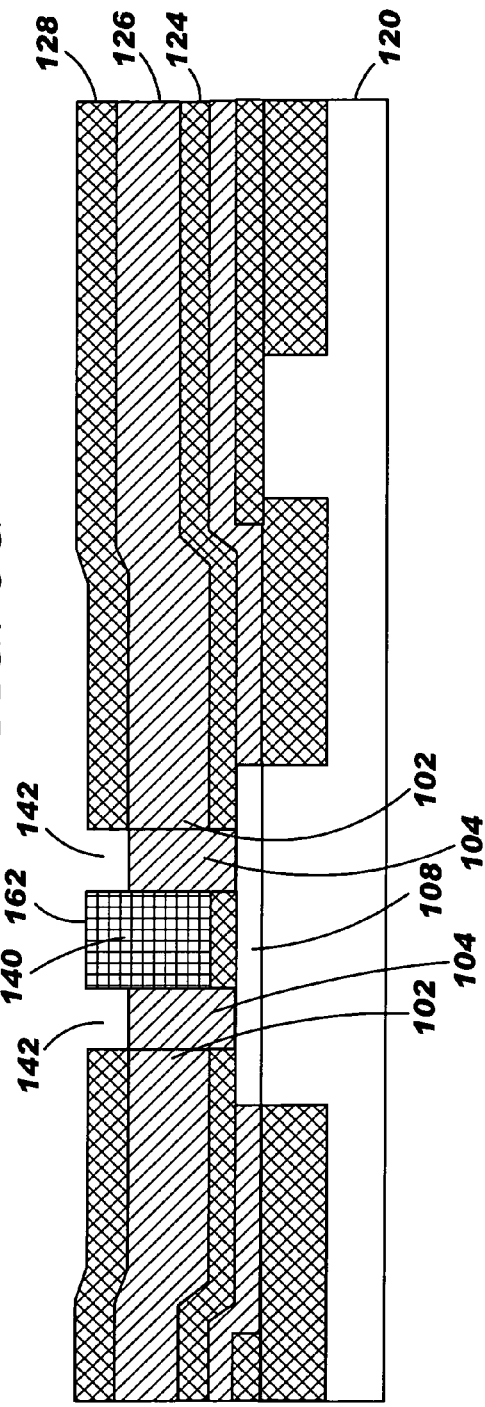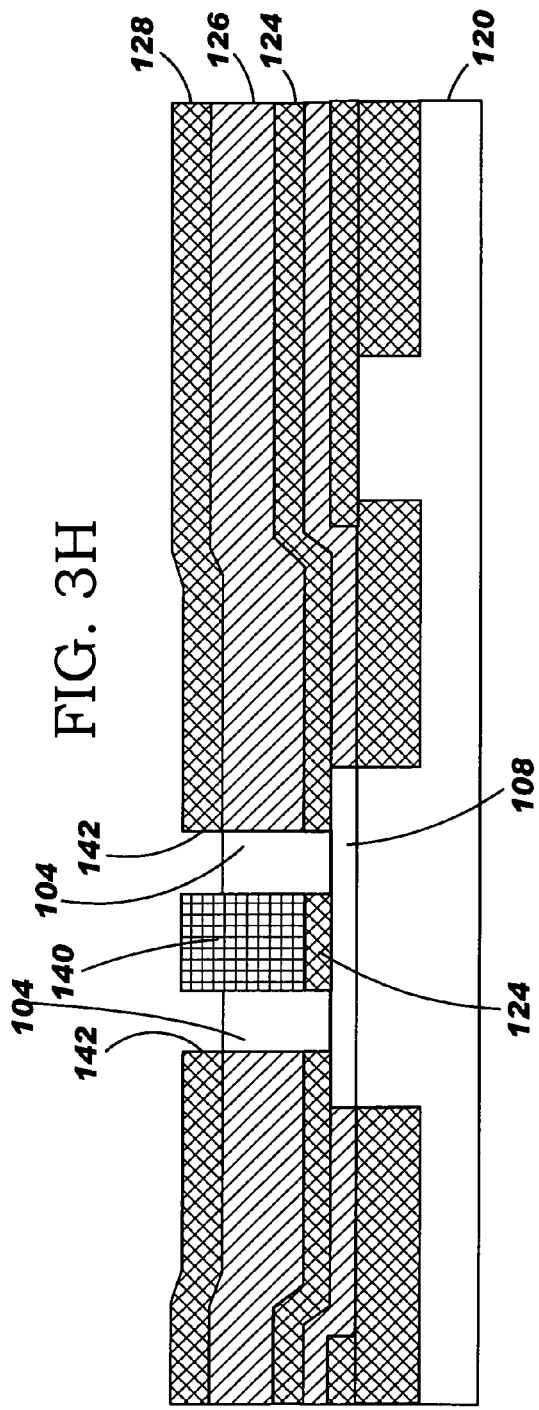

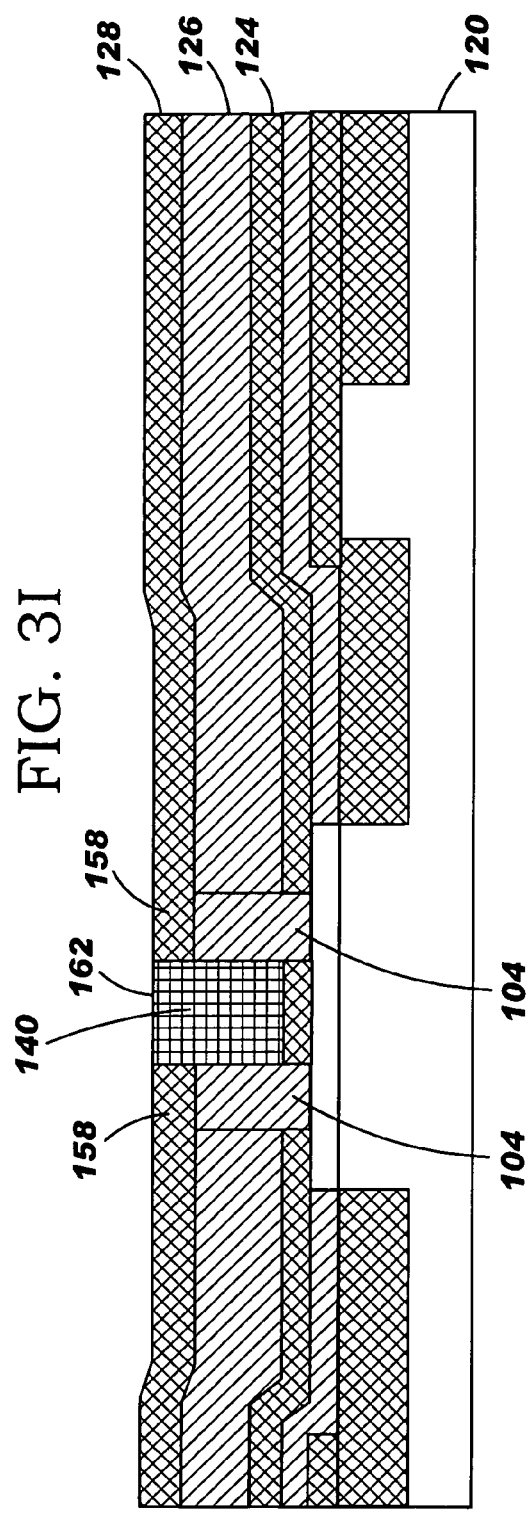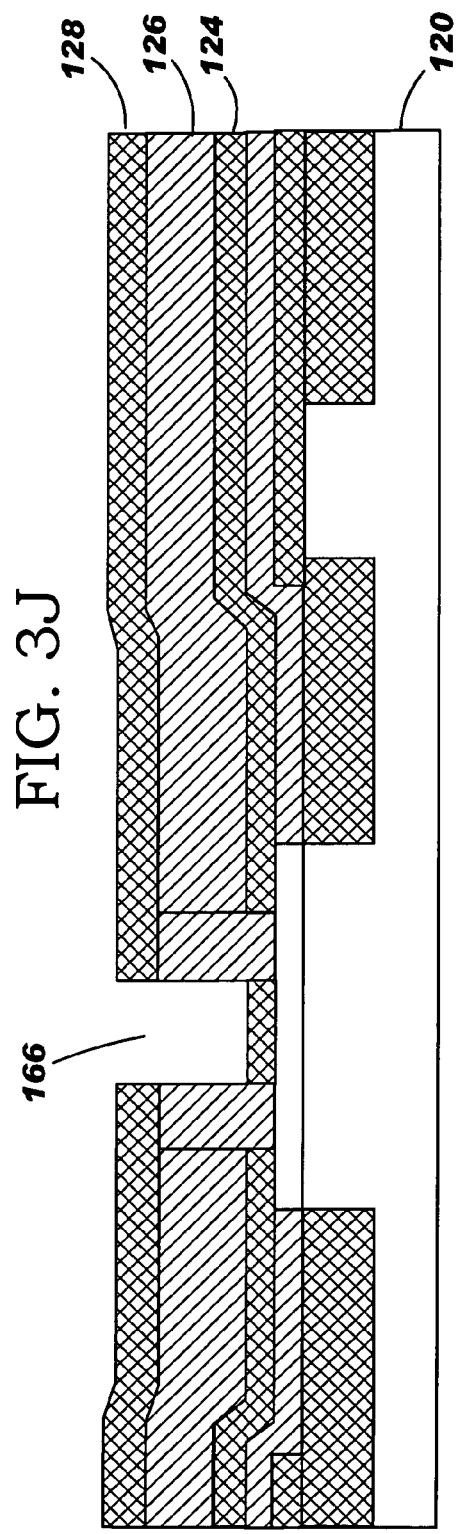

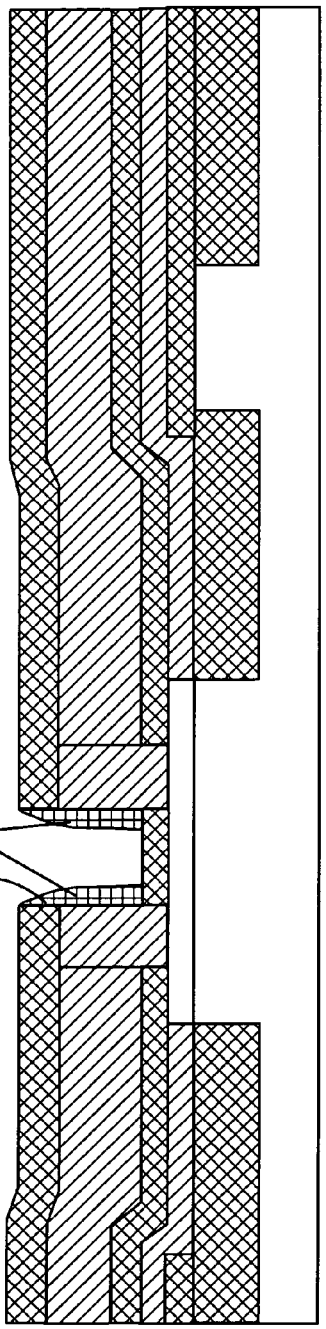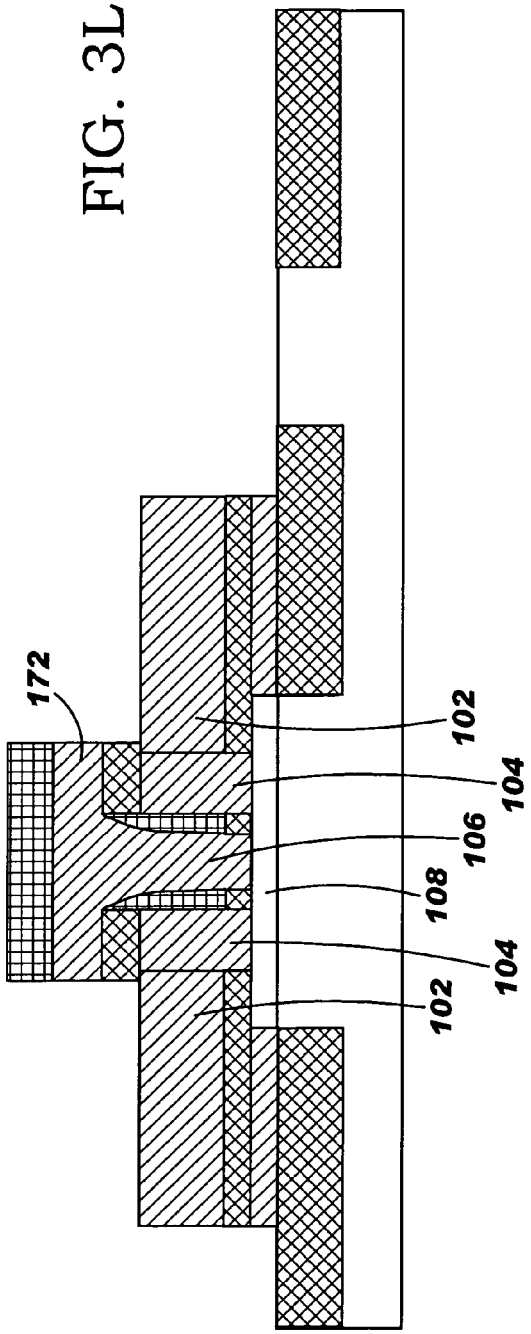

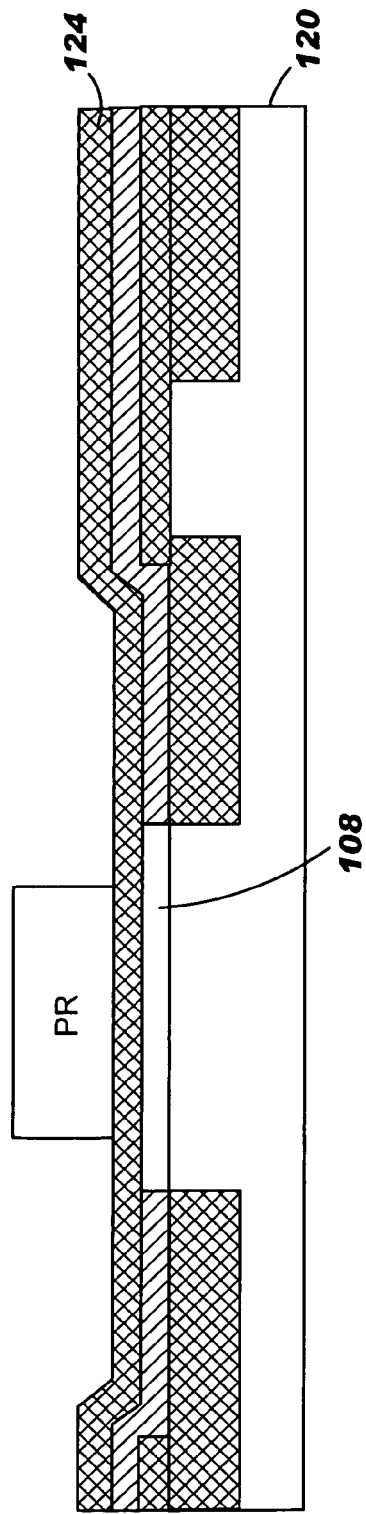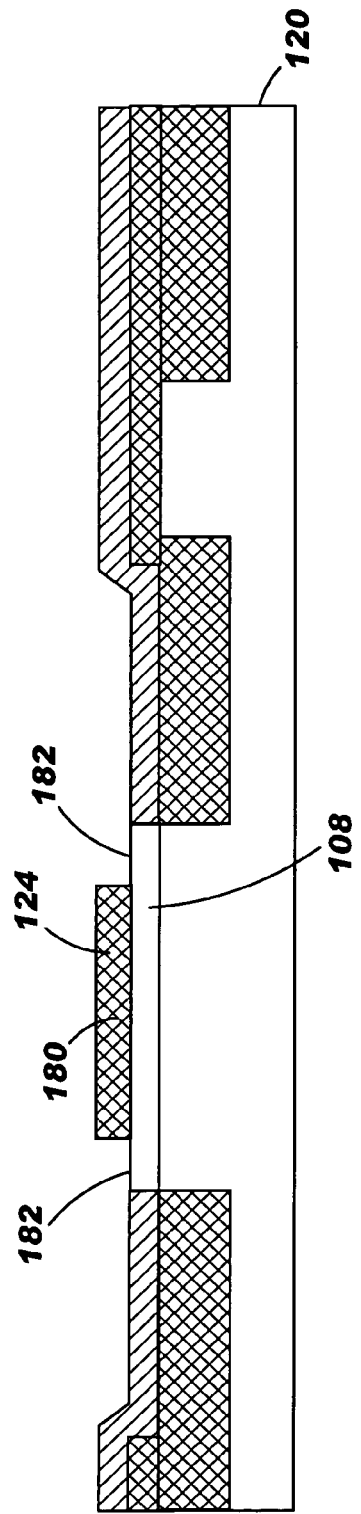

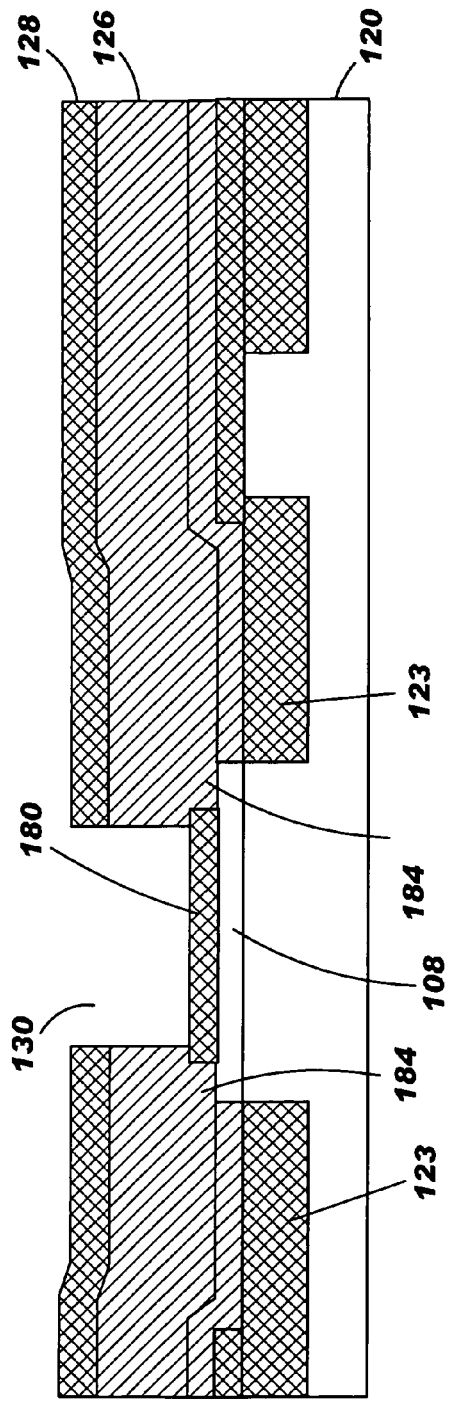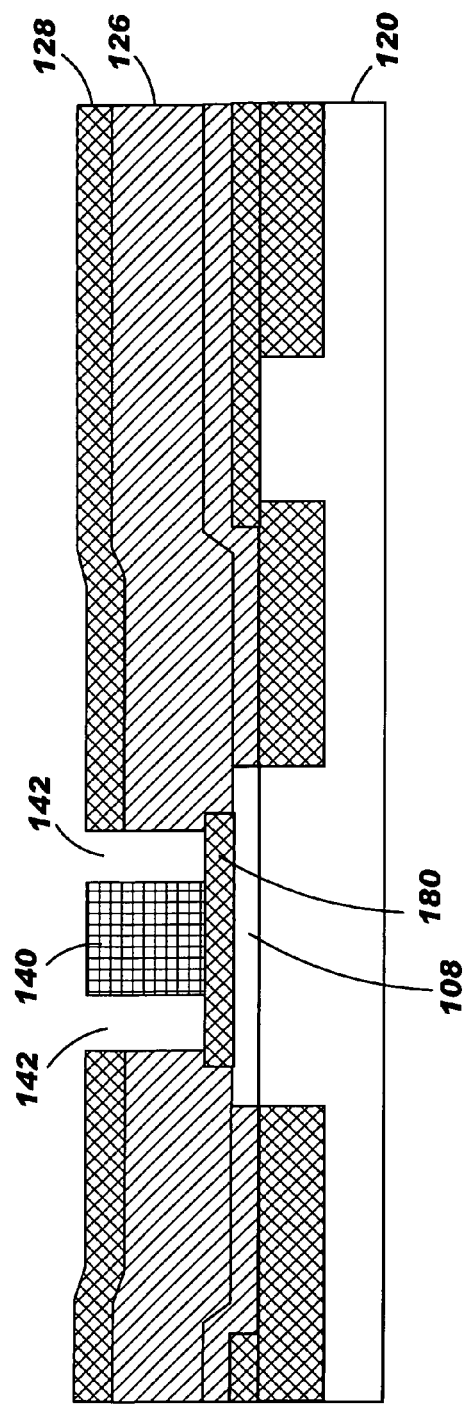

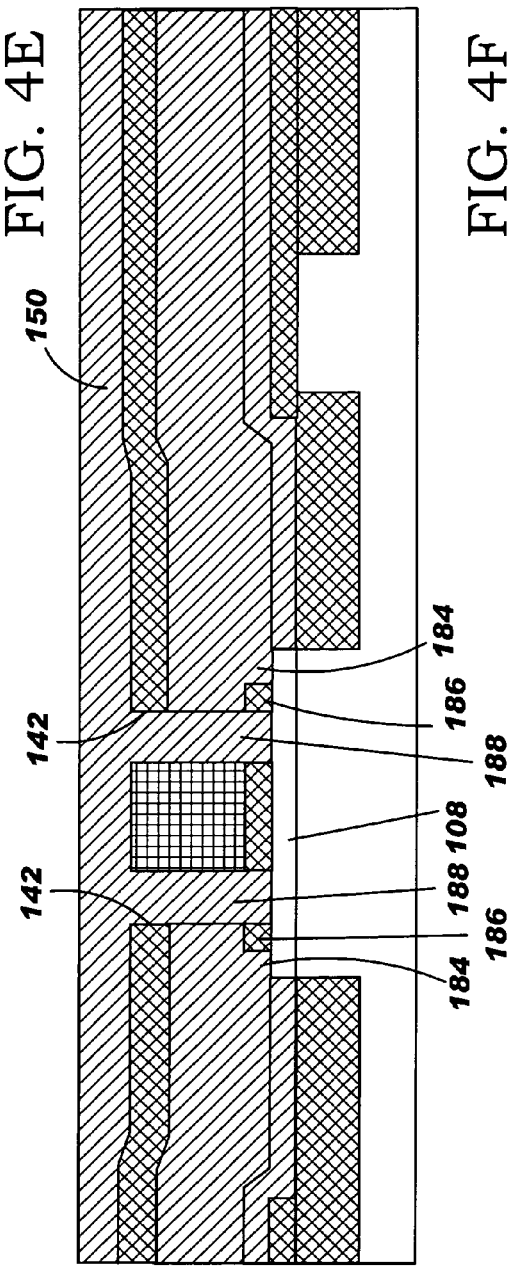
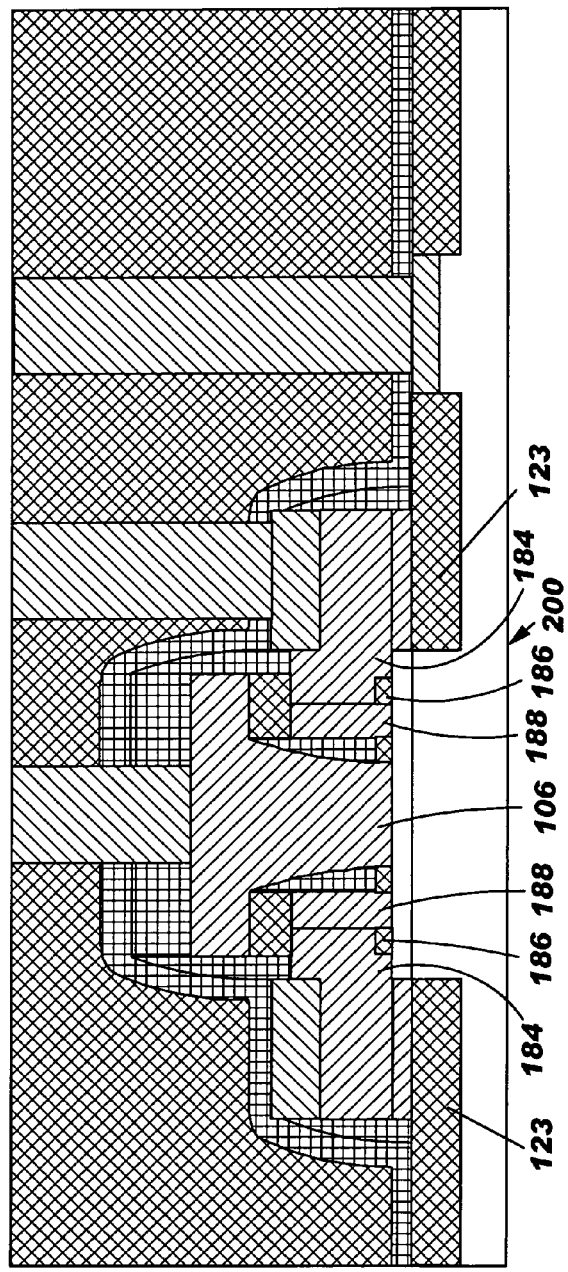
FIG. 4E
FIG. 4F

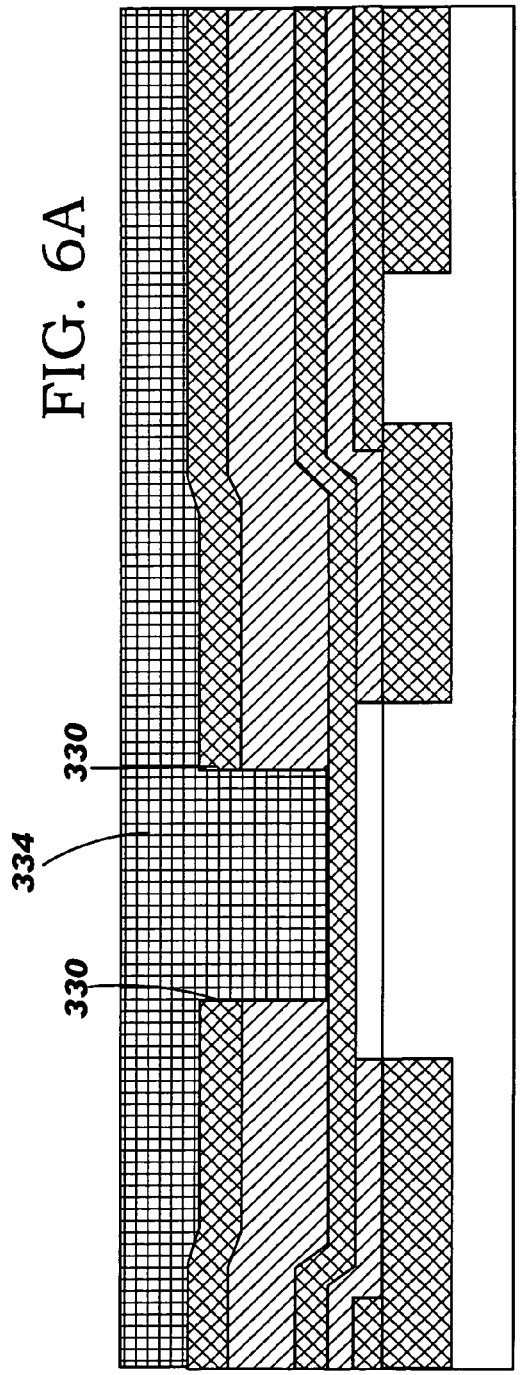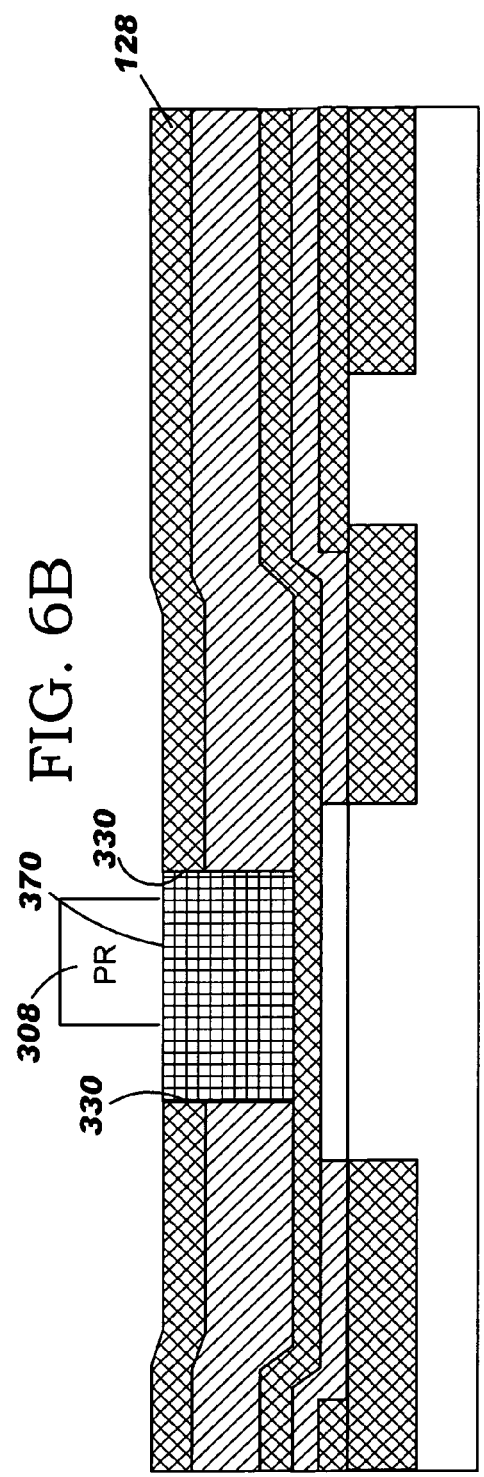

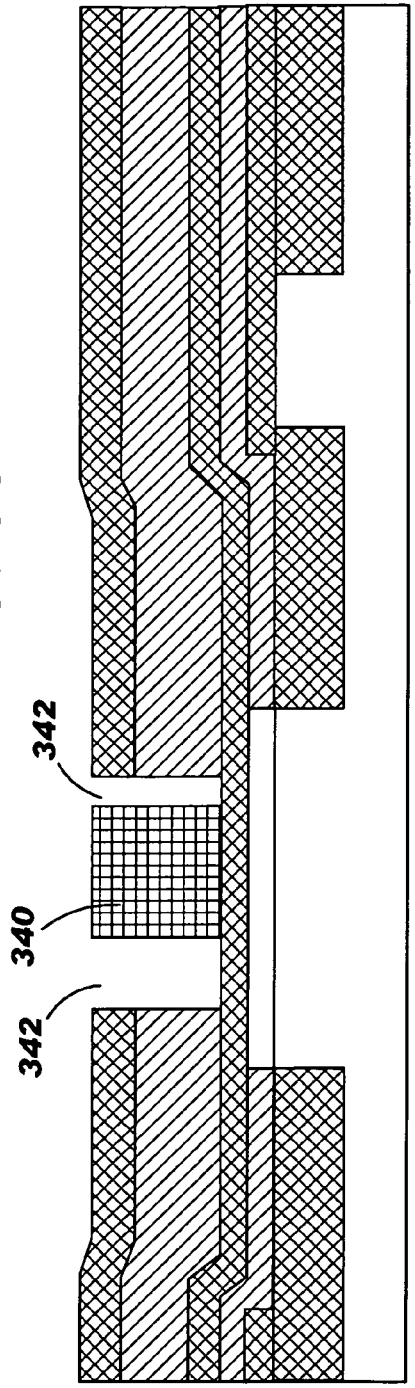
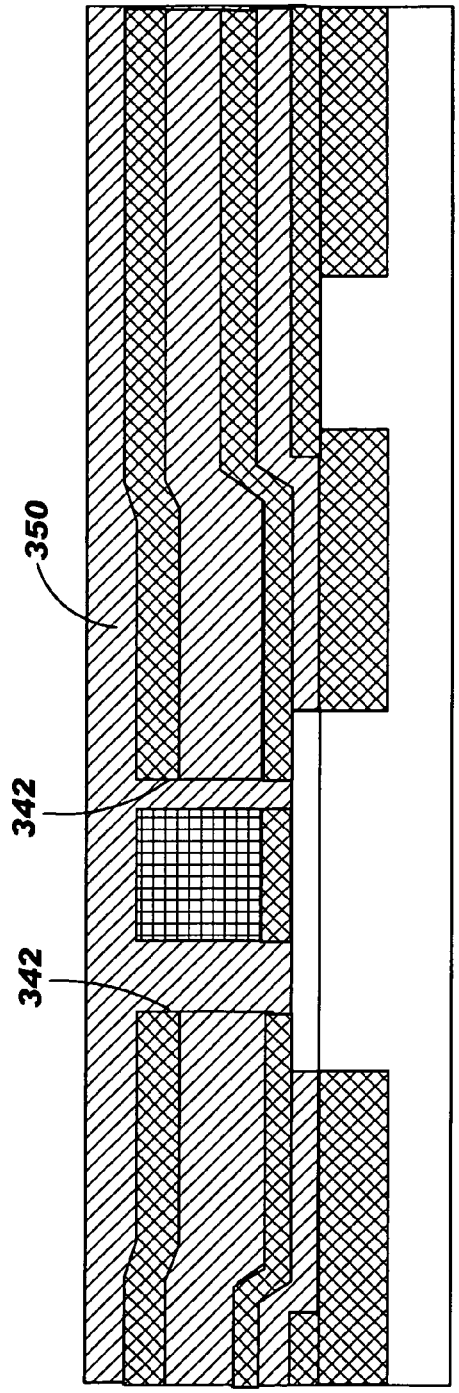
FIG. 6C
FIG. 6D

BIPOLAR TRANSISTOR SELF-ALIGNMENT WITH RAISED EXTRINSIC BASE EXTENSION AND METHODS OF FORMING SAME

This application is a divisional of application Ser. No. 10/604,212, filed Jul. 1, 2003, now U.S. Pat. No. 6,960,820.

BACKGROUND OF THE INVENTION

1. Technical Field

The present invention relates generally to a self-aligned bipolar transistor, and more particularly, to a self-aligned bipolar transistor having a raised extrinsic base and methods of forming the transistor.

2. Related Art

Self-aligned bipolar transistors with Silicon-Germanium (SiGe) intrinsic base and doped polysilicon raised extrinsic base are the focus of integrated circuits fabricated for high performance mixed signal applications. The performance of self-aligned bipolar transistors with extrinsic base degrades as the emitter dimension is reduced due to loss of intrinsic base definition caused by the lateral diffusion of dopants. To maintain high electrical performance, new transistors must have a polysilicon extrinsic base layer self-aligned to the emitter on top of the epitaxy grown intrinsic SiGe base, i.e., a raised extrinsic base. Transistors fabricated using this approach have demonstrated the highest cutoff frequency (Ft) and maximum oscillation frequency (Fmax) to date.

FIG. 1 shows a prior art transistor 10 with a raised extrinsic base 12 having a uniform lateral doping profile. A key performance feature of transistor 10 is the epitaxy grown intrinsic SiGe base 20 that contains the intrinsic portion of the base dopant. The Ge/Si ratio, doping level, and film thickness of the intrinsic base are primary factors in the emitter to collector transit time and corresponding Ft. Another key performance feature of transistor 10 is self-alignment, i.e., the spacing between extrinsic base 12 polysilicon to an emitter 14 polysilicon determined by sidewall spacer 16 rather than lithography (i.e. non-self-aligned). The small spacing is required to lower the base resistance component underneath spacer 16 to maintain a high Fmax.

A few different methods of forming a self-aligned bipolar transistor with raised polysilicon extrinsic base have been implemented. In one method, chemical mechanical polishing (CMP) is used to planarize the extrinsic base polysilicon over a pre-defined sacrificial emitter pedestal as described in U.S. Pat. Nos. 5,128,271 and 6,346,453. In this approach, an extrinsic base of area A and depth D has a low aspect ratio (D/A<<1), which can lead to a significant difference in the extrinsic base layer thickness between small and large devices, as well as isolated versus nested devices, due to dishing caused by the CMP. In another approach, an intrinsic base is grown using selective epitaxy inside an emitter opening and an undercut is formed under the extrinsic base polysilicon, as described in U.S. Pat. Nos. 5,494,836, 5,506,427, and 5,962,880. In this approach, the self-alignment of the extrinsic base is achieved with the epitaxial growth inside the undercut. In this case, special techniques are required to ensure a good link-up contact between the intrinsic base and the extrinsic base. Each of these approaches has significant process and manufacturing complexity.

In view of the foregoing, there is a need in the art for an improved self-aligned transistor with a raised extrinsic base and improved method of fabricating such a transistor that do not suffer from the problems of the related art.

SUMMARY OF THE INVENTION

The invention includes a self-aligned bipolar transistor structure having a raised extrinsic base comprising an outer region and an inner region of different doping concentrations and methods of fabricating the transistor. More specifically, the self-alignment of the extrinsic base to the emitter is accomplished by forming the extrinsic base in two regions. First, a first material including silicon or polysilicon of a first doping concentration is provided to form an outer extrinsic base region. Then a first opening is formed in the first material layer by lithography within which a dummy emitter pedestal is formed, which results in forming a trench between the sidewall of the first opening and the dummy pedestal. A second material layer of silicon or polysilicon having a second doping concentration is then provided inside the trench forming a distinct inner extrinsic base extension region to self-align the raised extrinsic base edge to the dummy pedestal edge. Since the emitter is formed where the dummy pedestal existed, the extrinsic base is also self-aligned to the emitter. The polysilicon or silicon forming the inner extrinsic base extension region can also be grown in the trench with selective or non-selective epitaxy.

In one embodiment, the dummy pedestal may be formed by depositing a conformal sacrificial layer in the first opening that forms a second opening smaller than the first opening. The thickness of the sacrificial layer and the dimension of the first opening define both the extrinsic base extension region dimension (i.e., trench) and the dummy pedestal (i.e., second opening) dimension. The second opening is filled with a filler material and the sacrificial layer is etched to form the emitter pedestal and the adjacent trench inside the first opening. In this case, an emitter size with a sub-lithographic dimension can be achieved by adjusting the sacrificial layer thickness. In other words, the emitter dimension is defined with the sacrificial layer thickness, which has a finer dimension resolution than lithography. Alternatively in another embodiment, the dummy pedestal may be formed by depositing and filling the first opening with a sacrificial material and defining the emitter pedestal with conventional lithographic techniques over the sacrificial material. In this case, the emitter dimension is defined by lithography in that the photoresist mask is used to define the dummy pedestal and the inner extrinsic base extension region from the sacrificial material inside the first opening. In this case, any misalignment between the first opening and the dummy pedestal caused by lithography will be cancelled by the unique self-alignment technique described herein, leading to a self-aligned transistor structure. In either case, the dummy pedestal is later removed to form an emitter opening into which an emitter is formed.

A first aspect of the invention is directed to a self-aligned bipolar transistor structure comprising: a raised extrinsic base including: an outer region; an inner extension region extending laterally inward from the outer region toward an emitter, the inner extension region horizontally non-overlapping the outer region; and an intrinsic base positioned below the raised extrinsic base.

A second aspect of the invention is directed to a transistor comprising: a raised extrinsic base including: an outer region that contacts an intrinsic base at a first location; and an inner extension region distinct from the outer region, the inner extension region contacting the intrinsic base at a second location laterally inward and separated from the first location.

A third aspect of the invention is directed to a method of fabricating a self-aligned bipolar transistor, the method comprising the steps of: forming a first opening to expose a first extrinsic base region; generating a dummy pedestal within the first opening, the dummy pedestal having a surrounding trench; forming an extrinsic base extension region in the trench, the extrinsic base extension region connecting the first extrinsic base region to an intrinsic base; removing the dummy pedestal to form an emitter opening; and forming an emitter in the emitter opening.

A fourth aspect of the invention is directed to a method of fabricating a self-aligned bipolar transistor, the method comprising the steps of: forming a first opening, using lithography, to expose an outer extrinsic base region; depositing a sacrificial layer in the first opening; forming, using lithography, a dummy pedestal in the sacrificial layer with a surrounding trench in the first opening; forming one of silicon and polysilicon in the trench to form an inner extrinsic base extension region connecting the outer extrinsic base region to an intrinsic base; removing the dummy pedestal to form an emitter opening; and forming an emitter in the emitter opening.

A fifth aspect of the invention is directed to a method of fabricating a self-aligned bipolar transistor, the method comprising the steps of: forming an opening in an outer extrinsic base region; generating an inner extrinsic base extension region connecting the outer extrinsic base region to an intrinsic base, the outer extrinsic base region and the inner extrinsic base region forming a raised extrinsic base; and forming a self-aligned emitter within the inner extrinsic base extension region and to the raised extrinsic base.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 3A-3L show a process to form the transistor of FIG. 2.

FIGS. 4A-4F shows steps of an alternative embodiment of the process shown in FIGS. 3A-3L.

FIGS. 6A-6E shows steps of an alternative process that illustrate an advantage of the invention.

DETAILED DESCRIPTION OF THE INVENTION

Figure 1:
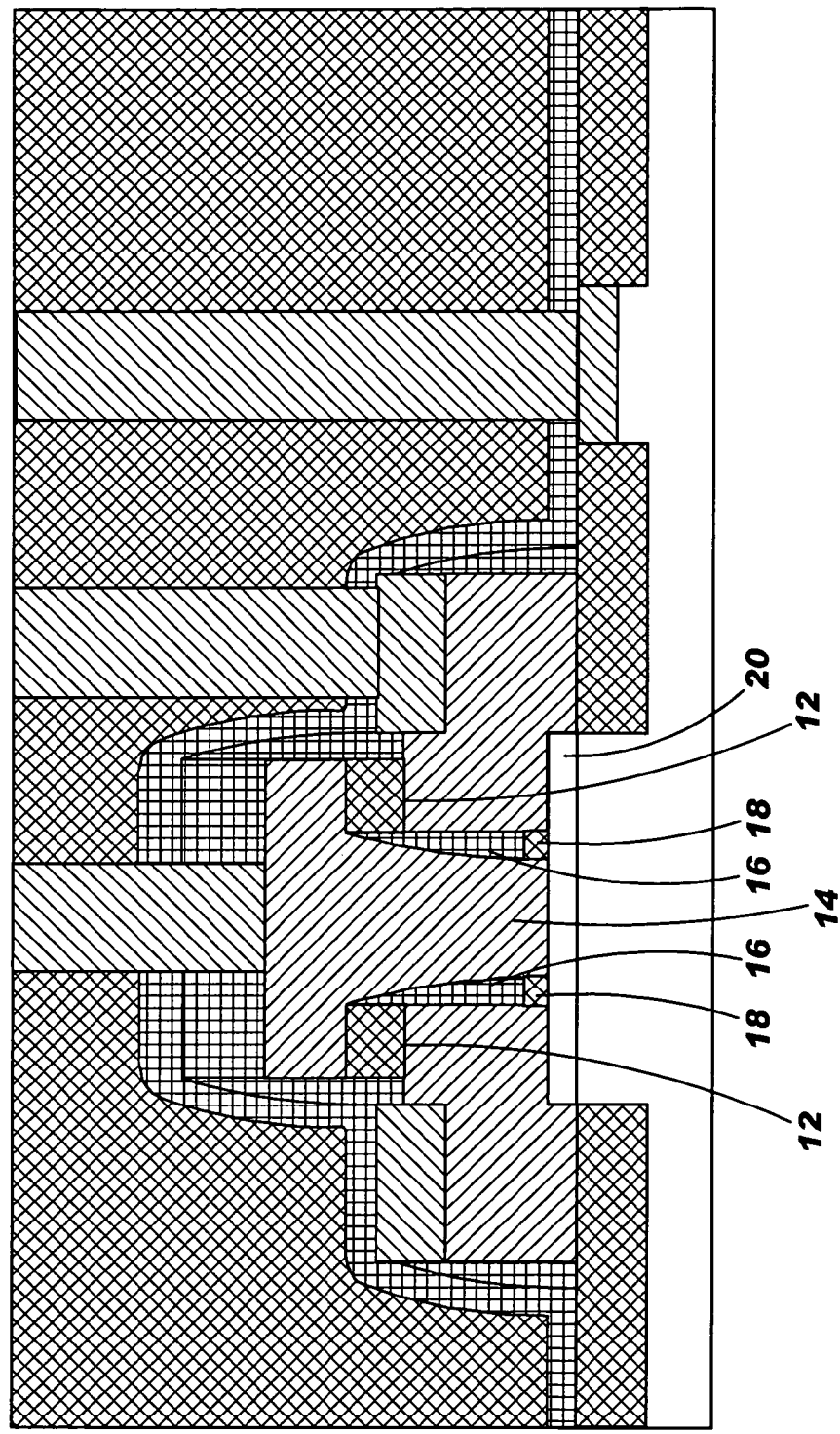
FIG. 1 shows a prior art transistor including a raised extrinsic base with a uniform lateral doping concentration formed in a conventional manner.
Figure 2:
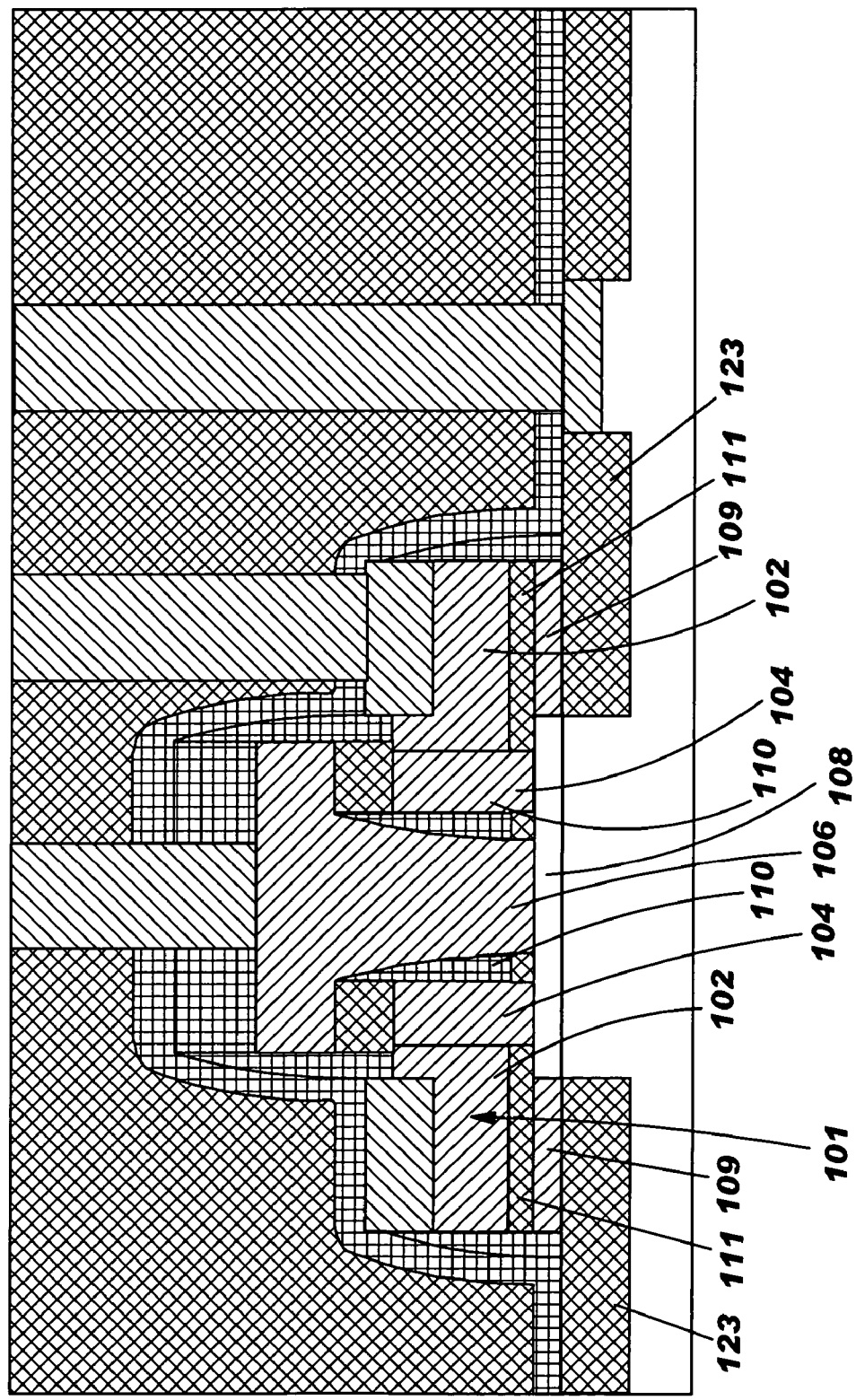
FIG. 2 shows a transistor including a raised extrinsic base formed according to the invention.

Referring to FIG. 2, a self-aligned bipolar transistor 100 (hereinafter "transistor 100") with a raised extrinsic base 101 according to the invention is illustrated. Transistor 100 includes a raised extrinsic base 101 including an outer extrinsic base region 102 (hereinafter "outer region") and an inner extrinsic base inner extension region 104 (hereinafter "inner extension region") extending laterally inward from outer region 102 toward an emitter 106. Inner extension region 104 is distinct from outer region 102 in that they are formed at different times or are not made with a single layer. Inner extension region 104 also does not horizontally overlap outer region 102. An intrinsic base 108 is positioned below raised extrinsic base 101 and below emitter 106. Outer region 102 has a first doping concentration and inner extension region 104 has a second doping concentration. In one embodiment, the first doping concentration of inner extension region 104 polysilicon (or silicon) is different than the second doping concentration of the outer region 102 polysilicon (or silicon), and preferably includes more dopant than outer region 102. Alternatively, the doping concentrations may be the same, however, having different dopant concentrations allows for improved device performance. Inner extension region 104 is separated from emitter 106 by spacer 110. Outer region 102 is separated from an outer region 109 of intrinsic base 108, positioned over a shallow trench isolation 123, by a dielectric layer 111. Other features of transistor 100 will be evident from the description that follows.

Figure 3A:
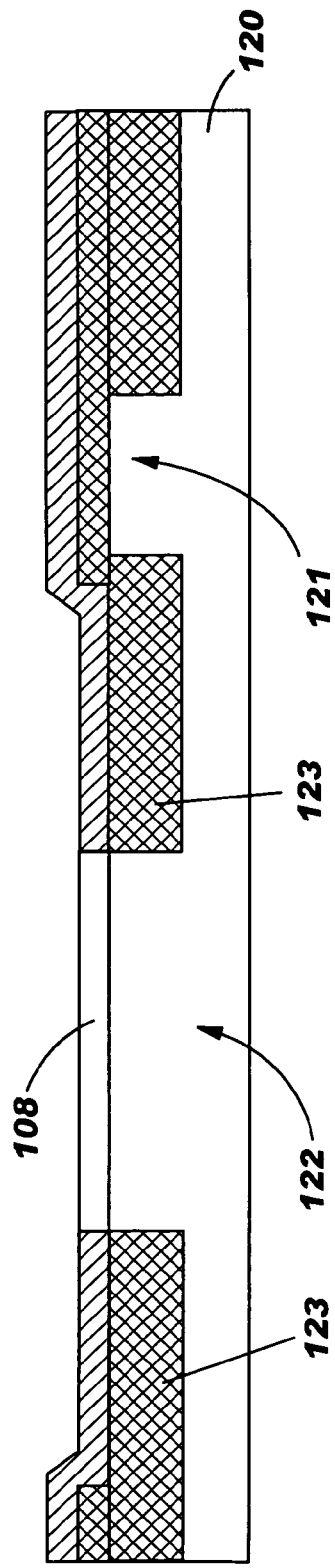

Referring to FIGS. 3A-3L, a first embodiment of a process to form transistor 100 will now be described. Referring to FIG. 3A, a crystalline silicon substrate 120 is preliminarily provided. Substrate 120 has a collector region 122 and a collector reachthrough region 121 to provide contact to collector region 122. On top of collector region 122, and in electrical contact with it, is a silicon or silicon-germanium (SiGe) intrinsic base layer 108, which may be formed, for example, by a contemporaneous epitaxy process or subsequent implantation. Other structure shown in FIG. 3A includes the required trench isolation, shallow trench isolation 123, sub-collector and collector implants, which are generated in a conventional fashion. Since these structures are not relevant to the inventive process, they will not be discussed further unless necessary.

Figure 3B:
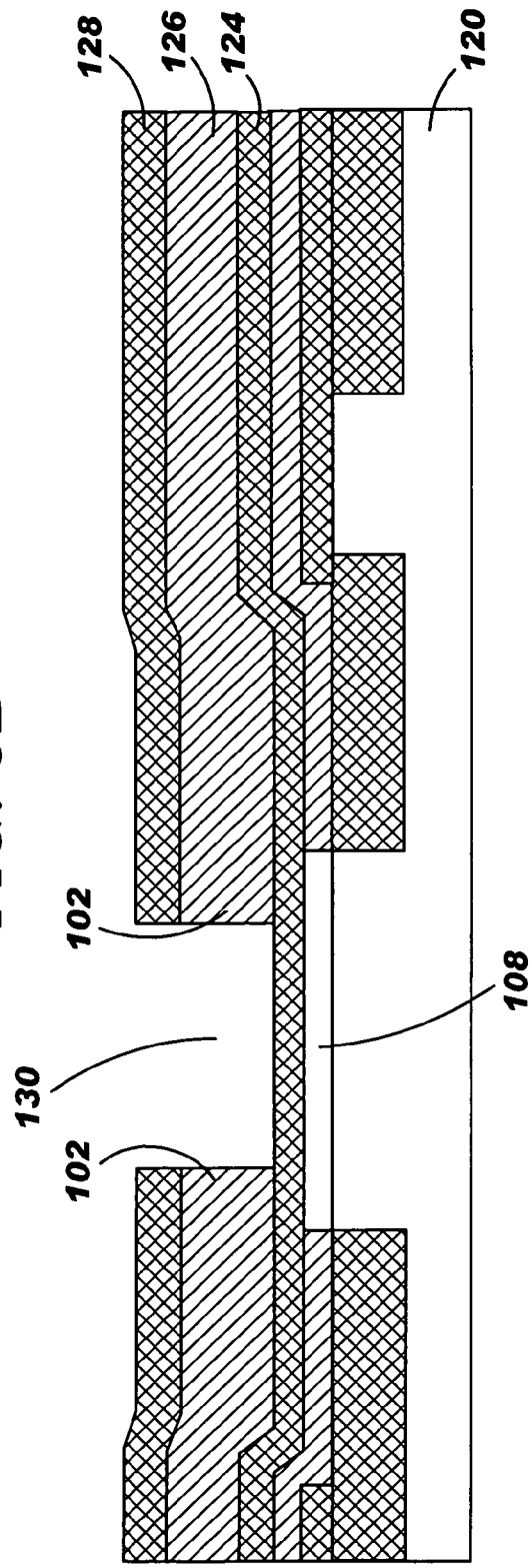

FIG. 3B shows initial steps of the process including depositing a first dielectric layer 124. Subsequent processing forms dielectric layer 111, as discussed relative to FIG. 2, from first dielectric layer 124. Next, a first polysilicon 126 is deposited, which will eventually form outer region 102. Alternatively, outer region 102 may also be provided as a silicon layer. In either case, the material (i.e., first polysilicon 126 or the silicon) is preferably formed (e.g., deposited or grown) as a doped material, however, the material may alternatively be formed and then doped in any known fashion. Lastly, a second dielectric layer 128 is deposited to provide isolation between extrinsic base 101 (FIG. 2) and emitter 106 (FIG. 2). Each layer is deposited at least over intrinsic base 108. First dielectric layer 124 acts as an etch stop layer to protect intrinsic base 108, as will be described below. Each dielectric layer 124, 128 may be made of any now known or later developed dielectric material such as silicon oxide, silicon nitride, etc. FIG. 3B also shows the step of forming a first opening 130 to expose outer region 102, i.e., first polysilicon 126, over intrinsic base 108 using lithography. In particular, a photoresist may be coated on substrate 120, exposed and developed, and then etched through second dielectric layer 128 and first polysilicon layer 126, stopping on first dielectric layer 124. If doping of implanted intrinsic base 108 is required, it may be conducted at this point.

FIGS. 3C-3E show a first embodiment for generating a dummy pedestal 140 (FIG. 3E) within first opening 130 and a surrounding trench 142 (FIG. 3E) around dummy pedestal 140. FIG. 3C shows conformally depositing a sacrificial layer 134 in first opening 130 to form a second opening 136 that is smaller than first opening 130. Sacrificial layer 134 may be any conformal dielectric film now known or later developed for use as a sacrificial layer such as silicon nitride, etc. As will be explained further, sacrificial layer 134 defines the size of second opening 136, which defines the size of dummy pedestal 140 (FIG. 3E). Since emitter 106 (FIG. 2) will eventually be provided where dummy pedestal 140 exists, the pedestal also defines the size of the emitter. In addition, sacrificial layer 134 defines the size of trench 142 (FIG. 3E), and hence the size of inner extension region 104 (FIG. 2). Since the thickness of sacrificial layer 134 can be controlled to sub-lithographic dimensions, the size of emitter 106 (FIG. 2) can be set at smaller sizes than lithography (<0.1 micron) can produce. As shown in FIG. 3D, a filler material 138, such as a photoresist, is deposited in second opening 136, and etched back. Alternatively, other filler materials in the form of conformal dielectric films such as silicon dioxide, silicon nitride, polysilicon or a combination thereof may be deposited and etched back or planarized via CMP to obtain a hard mask inside second opening 136.

FIG. 3E shows a dummy pedestal 140 (below where second opening 136 existed) and trench 142 around dummy pedestal 140 formed by removing sacrificial layer 134 and filler material 138, e.g., by anisotropically etching with filler material 138 as an etch mask. Once complete, filler material 138 is stripped. As shown in FIG. 3E, etching stops on first dielectric layer 124.

FIG. 3F shows a first embodiment for forming inner extension region 104 including deposition of a second polysilicon 150 in trench 142 after removal of an exposed portion of first dielectric layer 124 at the bottom of trench 142 with wet or RIE to expose intrinsic base 108. Second polysilicon 150 is then recessed back as shown in FIG. 3G to form inner extension region 104, which is in electrical connectivity with outer region 102 and intrinsic base 108. Second polysilicon 150 is preferably deposited as a doped polysilicon, however, the polysilicon may alternatively be deposited, recessed, and then doped in any known fashion. Second polysilicon 150 is deposited in sufficient thickness to fill trench 142 and to allow for planarization of the polysilicon by etch-back, or CMP and etch-back. Note that using CMP to planarize second polysilicon 150 should not result in large differences in the extrinsic base polysilicon thickness between small and large devices, or isolated versus nested devices, since the aspect ratio of trench 142 is high (i.e., D/A>>1). Inner extension region 104 is formed to electrically connect outer region 102 to intrinsic base 108 and to self-align the edge of extrinsic base 101 (FIG. 2) to the edge of emitter 106 (FIG. 2). Second polysilicon 150 that forms inner extension region 104 may have the same or different doping concentration as first polysilicon 126 (outer region 102) to optimize device performance. As noted above, in one embodiment, inner extension region 104 has a higher dopant concentration than outer region 102. FIG. 3G also shows how a top of inner extension region 104 is preferably provided below a top surface 162 of dummy pedestal 140, i.e., a portion of trench 142 continues to exist adjacent dummy pedestal 140, so that each inner extension region 104 can be capped.

FIG. 3H shows an alternate method of forming inner extension region 104. In this case, inner extension region 104 is formed as silicon with selective epitaxy growth. In particular, silicon is selectively grown inside trench 142 to form inner extension region 104 to electrically connect outer region 102 with intrinsic base 108, and to self-align the overall extrinsic base to dummy pedestal 140. In this case, no CMP or etch-back is required to form inner extension region 104. Inner extension region 104 may be in-situ doped while grown or implanted after growth to have a doping concentration different than outer region 102. For brevity, the drawings do not show a silicon inner extension region 104 other than in FIG. 3H.

FIG. 3I shows formation of a cap 158, i.e., a dielectric layer extension, for inner extension region 104 to provide electrical isolation between inner extension region 104 and emitter 106 (FIG. 2). In one embodiment, cap 158 is formed by depositing a third dielectric layer (not shown), and then planarizing or etching back to top surface 162 of dummy pedestal 140 and a top surface of second dielectric layer 128 to form cap 158 for inner extension region 104. Cap 158 may also be provided by oxidation of inner extension region 104 selectively through trench 142. As shown, the third dielectric layer may form a single dielectric layer with second dielectric layer 128. Alternatively, second dielectric layer 128 can be removed with wet or RIE etching and a single dielectric isolation layer over both inner extension region 104 and outer region 102 can be formed by oxidation of top surfaces of inner extension region 104 and outer region 102. In this case, the oxide will form only on top surface of the extrinsic base regions 102 and 104 and not on top surface 162 of dummy pedestal 140 as shown in FIG. 3I.

Next, as shown in FIG. 3J, dummy pedestal 140 is removed, e.g., by selective RIE or wet etching selective to the portion of first dielectric layer 124, to form a third, emitter opening 166. The provision of inner extension region 104 allows fine control self-alignment of the extrinsic base (regions 102 and 104) with an emitter 106 (FIG. 2) to be formed in third, emitter opening 166.

FIG. 3K shows formation of a spacer 110 on a sidewall of third, emitter opening 166. Spacer 110 may include any now known or later developed spacer material such as silicon nitride. Spacer 110 provides electrical isolation between the emitter and the extrinsic base. In addition, the width of spacer 110 determines the final emitter size and the final spacing between the emitter edge and the extrinsic base edge and can be adjusted to improve the device performance. More specifically, the width of spacer 110 can be made thin to minimize the base resistance component underneath the spacer to further increase Fmax of the transistor.

FIG. 3L shows the transistor structure after steps for forming an emitter 106 in third, emitter opening 166 (FIG. 3K). Following the formation of spacer 110 in FIG. 3K, an exposed portion of first dielectric layer 124 is removed selectively by wet or RIE etching such that intrinsic base 108 is exposed to ensure electrical contact between emitter 106 and intrinsic base 108. FIG. 3L shows the results of deposition and patterning of a third doped polysilicon 172 to form emitter 106 in third, emitter opening 166. Emitter 106 has a minimum width that is less than current lithographic ability, e.g., <0.1 microns. FIG. 3L also shows the results of further steps to define the raised extrinsic base region 101 (FIG. 2) including outer region 102 and inner extension region 104. It should be recognized that the processing shown in FIG. 3L is merely illustrative and that other processing may be provided to form emitter 106 and define the raised extrinsic base region 101 (FIG. 2) or otherwise finalize transistor 100 (FIG. 2). Other finalization steps may include a high temperature anneal to drive in the dopant, and formation of silicide, dielectric layers, metal contacts, etc., resulting in transistor 100 shown in FIG. 2.

It should be recognized that the particular shapes and locations of structure shown in FIGS. 3A-3L may be adjusted and still implement the teachings of the invention. For example, referring to FIGS. 4A-4F, an alternative embodiment for some of the steps of the above process is illustrated. In this alternative embodiment, as shown in FIGS. 4A-4B, rather than provide a blanket first dielectric layer 124, the layer may be patterned by conventional photolithography (via photoresist PR in FIG. 4A) and etched to form an etch stop pad 180 (FIG. 4B) over intrinsic base 108. Etch stop pad 180 leaves exposed area 182 of intrinsic base 108. As shown in FIG. 4C, deposition of first polysilicon 126 and second dielectric layer 128 may proceed such that an outer extrinsic base region 184 makes direct contact with intrinsic base 108 in the area between etch stop pad 180 and shallow trench isolation 123. Processing then may proceed as with the embodiment shown in FIGS. 3B-3L. In this case, first opening 130 is formed over etch stop pad 180 such that it is aligned with and smaller than etch stop pad 180. Dummy pedestal 140 and trench 142 are then formed as described above relative to FIGS. 3C-3E, and as shown in FIG. 4D. As shown in FIG. 4E, after removal of etch stop pad 180 within trench 142, a portion 186 of etch stop pad 180 remains. FIG. 4E also shows second polysilicon 150 forming an inner extrinsic base extension region 188, which electrically connects outer extrinsic base region 184 to intrinsic base 108, and self-aligns the raised extrinsic base to the emitter.

As shown in FIG. 4F, portion 186 is positioned between outer extrinsic base region 184 and extrinsic base extension region 188 such that outer region 184 contacts intrinsic base 108 at a location separated from a location where extension region 188 contacts the intrinsic base. Accordingly, outer extrinsic base region 184 is in direct contact with intrinsic base 108 in the region between an outer edge of portion 186 and shallow trench isolation 123 as compared to outer region 102 shown in FIG. 2, i.e., outer region 184 and extension region 188 each contact intrinsic base 108. The larger contact area between raised extrinsic base 184, 188 and intrinsic base 108 results in lower overall base resistance. The increased contact area between outer extrinsic base region 184 and intrinsic base 108 near an edge of shallow trench isolation 123 may result in higher parasitic base to collector capacitance (Ccb). This is caused by dopant diffusion from outer extrinsic base region 184 to the base/collector junction near an edge of shallow trench isolation 123. However, the parasitic capacitance can be kept low while keeping a large contact area between extrinsic base 184, 188 and intrinsic base 108 by reducing the doping concentration of outer extrinsic base region 184, which is made possible by the unique method of fabricating transistor 200 as described herein.

Figure 5A:
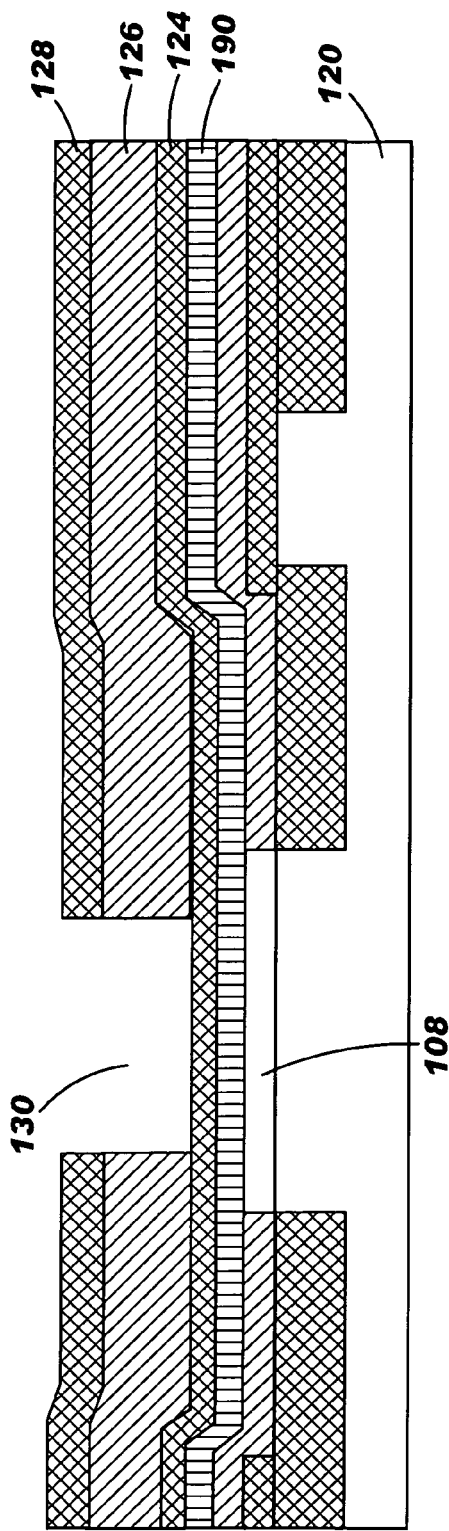
FIGS. 5A-5G shows steps of an alternative embodiment of the process shown in FIGS. 3A-3L.
Figure 5B:
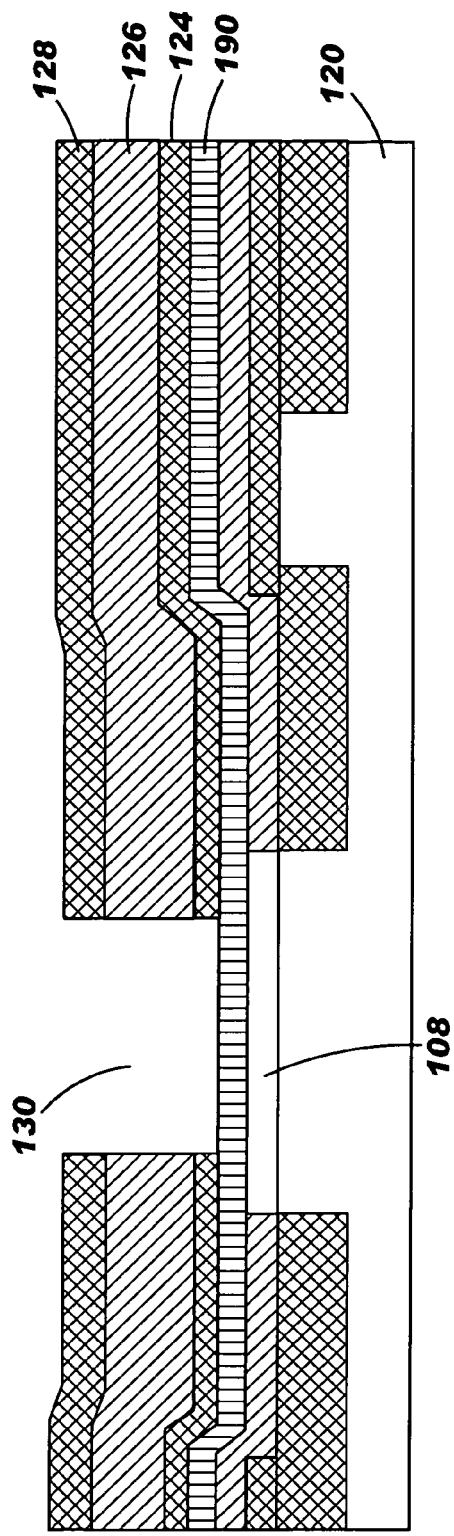
Figure 5C:
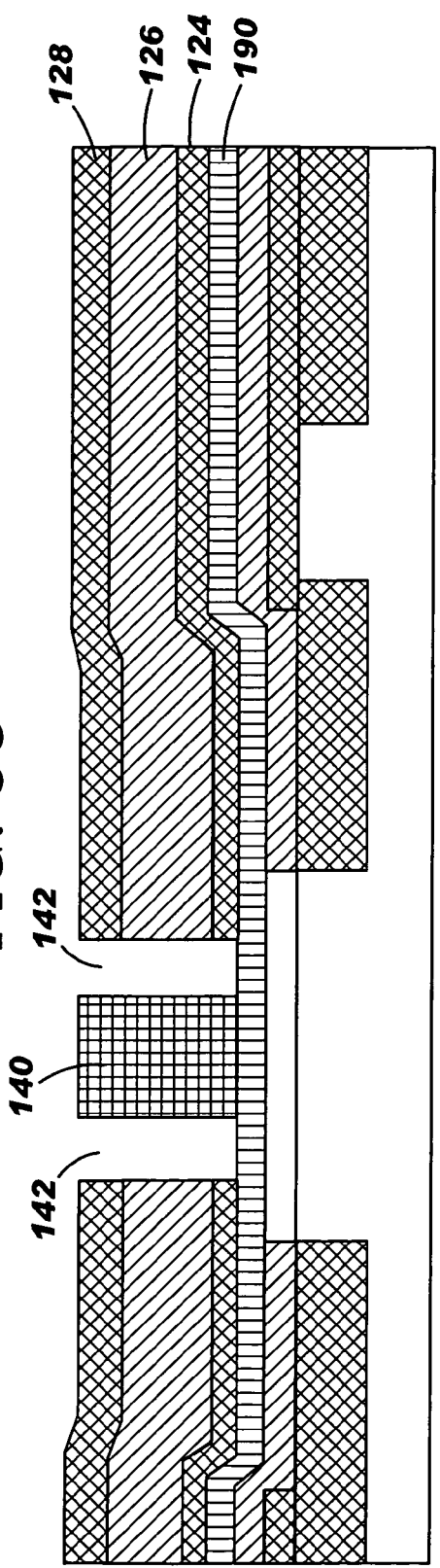
Figure 5D:
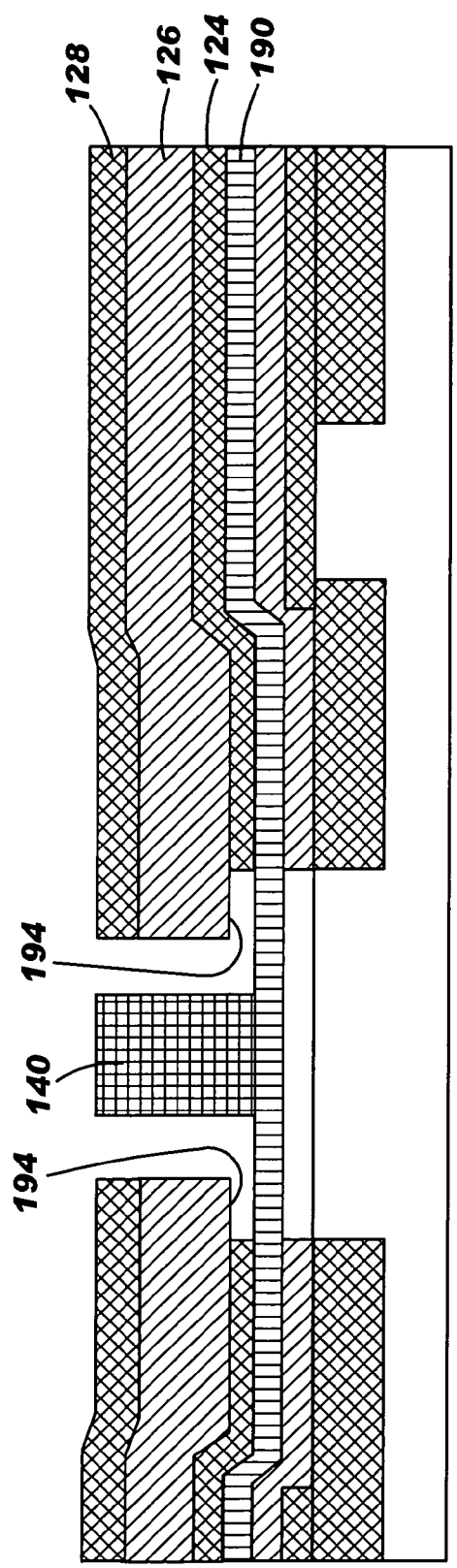

Referring to FIGS. 5A-5G, another alternative embodiment for some of the steps of the above process is illustrated. This alternative embodiment includes, as shown in FIG. 5A, thermally growing a thermal oxide layer 190 prior to depositing first dielectric layer 124. Processing thereafter proceeds, as shown in FIG. 5A, with formation of a first opening 130 through at least first polysilicon 126 over intrinsic base 108 using lithography. In particular, a photoresist (not shown) is deposited over substrate 120, exposed and developed. In the case of the alternative embodiment, as shown in FIGS. 5A-5B, first opening 130 is formed by etching second dielectric layer 128, first polysilicon 126 and first dielectric layer 124 and stopping selectively on thermal oxide layer 190. A sacrificial layer (not shown) is then deposited in first opening 130 to form a second opening (136 in FIG. 3C) that is smaller than first opening 130. The sacrificial layer is used to set a size of the desired emitter 106 (FIG. 2). Next, a filler material (138 in FIG. 3D) is deposited in the second opening (136 in FIG. 3D). FIG. 5C shows the resulting dummy pedestal 140 (below where the second opening existed) and a trench 142 around the dummy pedestal 140, which is formed by removing the sacrificial layer by anisotropic RIE etching and removing the filler material with wet or RIE etching. Trench 142 extends to thermal oxide layer 190 rather than just to first dielectric layer 124. FIG. 5D shows recessing of first dielectric layer 124 isotropically and selectively to thermal oxide layer 190 by wet etching, to form a ledge (or cavity) 194 under first polysilicon 126. In this case, etching chemistry is such that first dielectric layer 124, e.g., of silicon dioxide, is etched faster than thermal oxide layer 190. The etching of FIGS. 5C and 5D may be completed contiguously where desired.

Figure 5E:
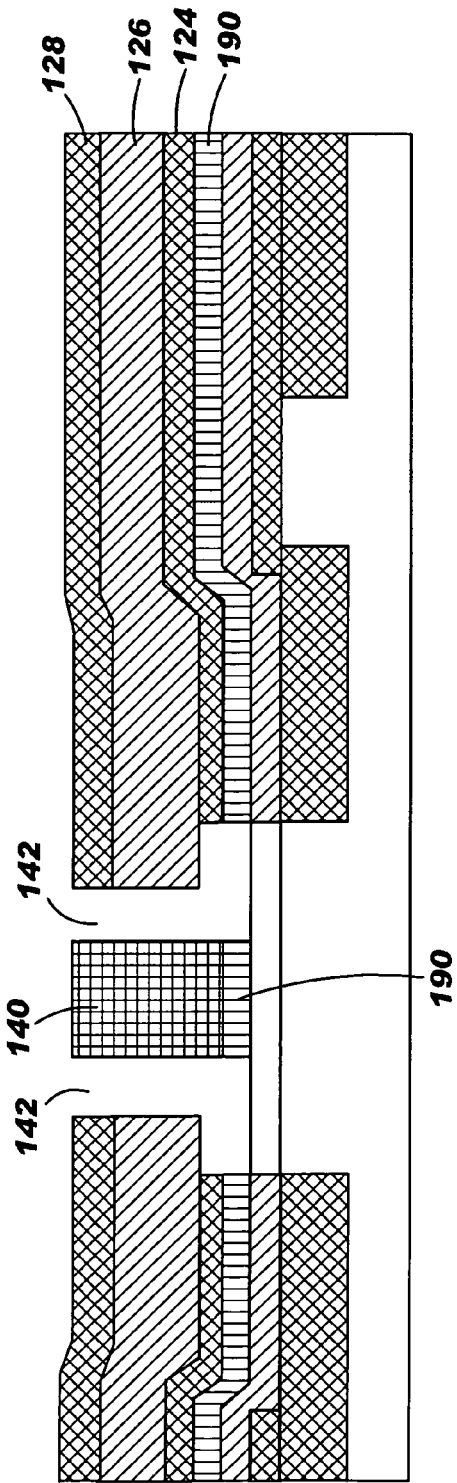
Figure 5F:
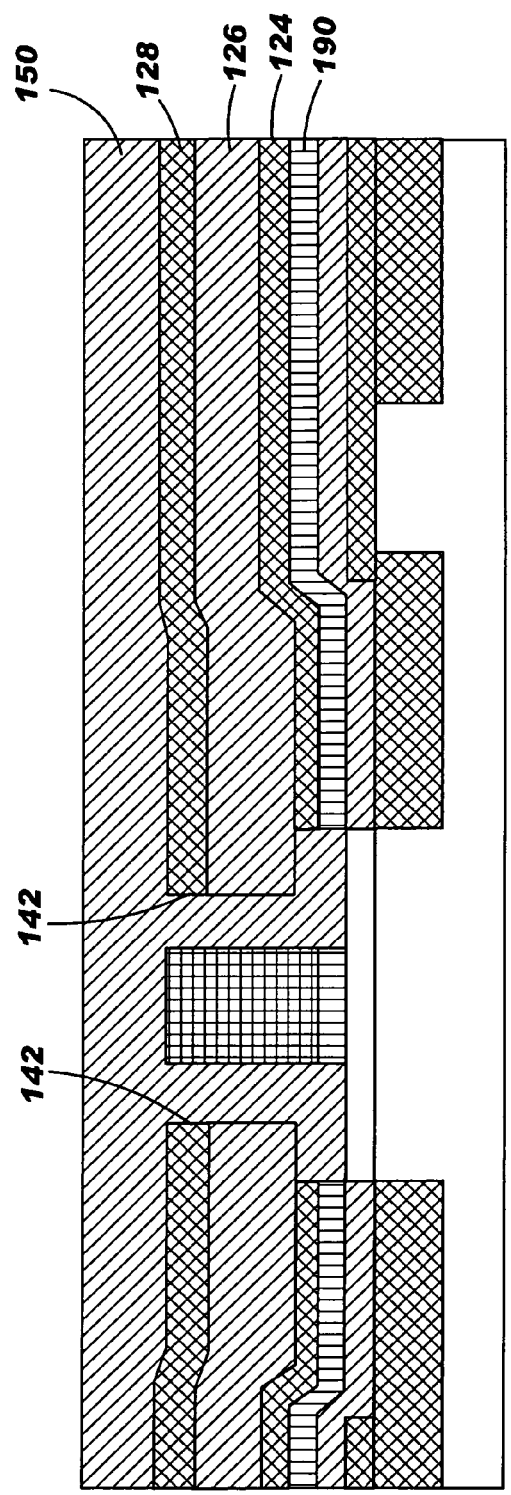
Figure 5G:
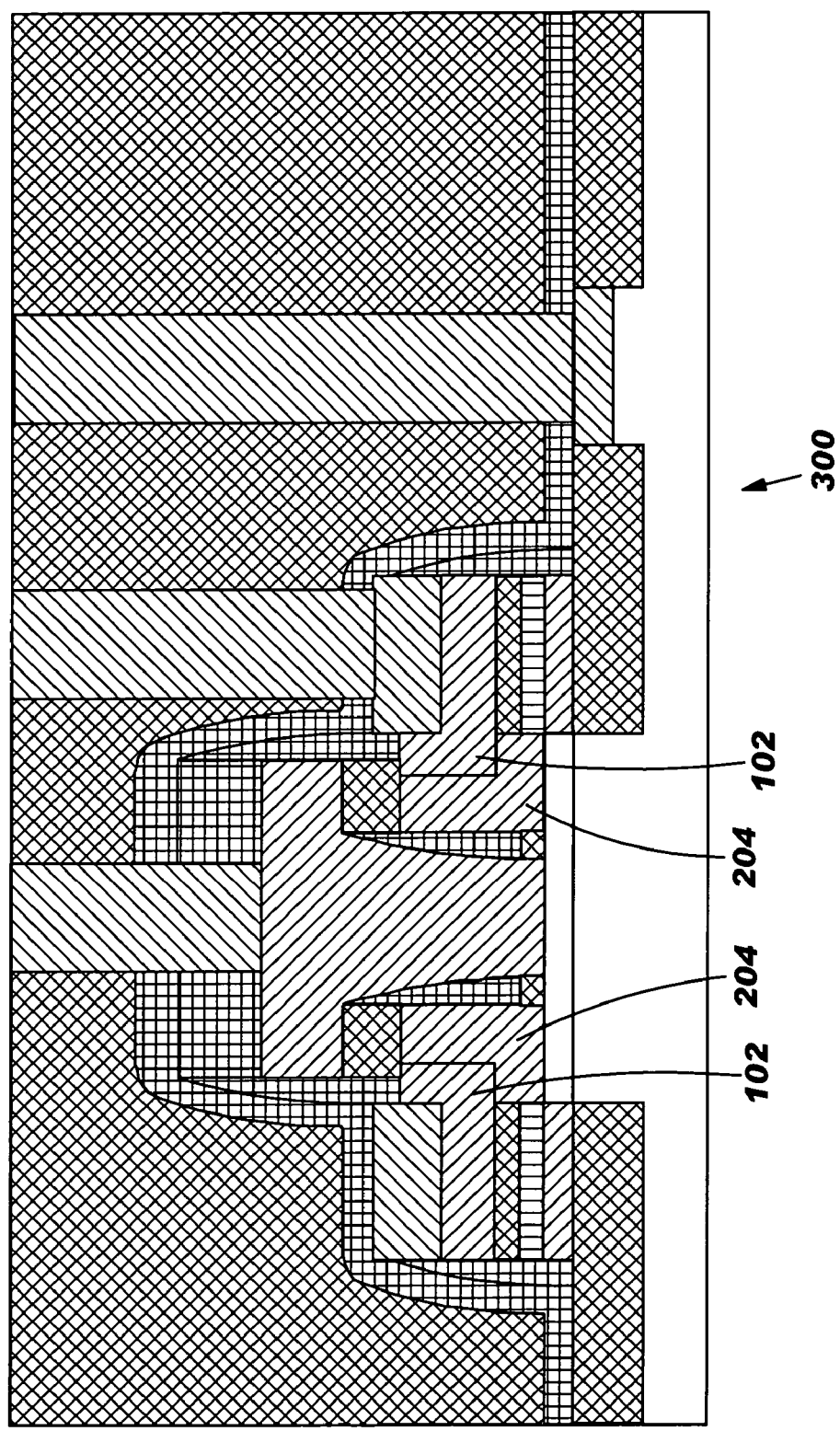

FIG. 5E shows removal of thermal oxide layer 190 isotropically and selectively to an edge of first dielectric layer 124 under ledge 194 and extending trench 142 to intrinsic base 108. The result of this processing is a trench 142 having an L-shape cross-section. In this case, etching chemistry (e.g., vapor phase hydrofluoric acid) is such that thermal oxide layer 190 is etched faster than first dielectric layer 124. Thermal oxide layer 190 remains under dummy pedestal 140. FIG. 5F shows deposition of second polysilicon 150 in trench 142 to form an inner extrinsic base extension region 204 as shown in FIG. 5G. Extension region 204, in this case, has an L-shape cross-section and extends under outer region 102 to provide additional contact area with outer region 102. This configuration lowers the overall resistance of the raised extrinsic base 102, 204 and improves device performance. Subsequent processing proceeds substantially similar to that shown in FIGS. 3G-3L to generate transistor 300, as shown in FIG. 5G.

Figure 6E:
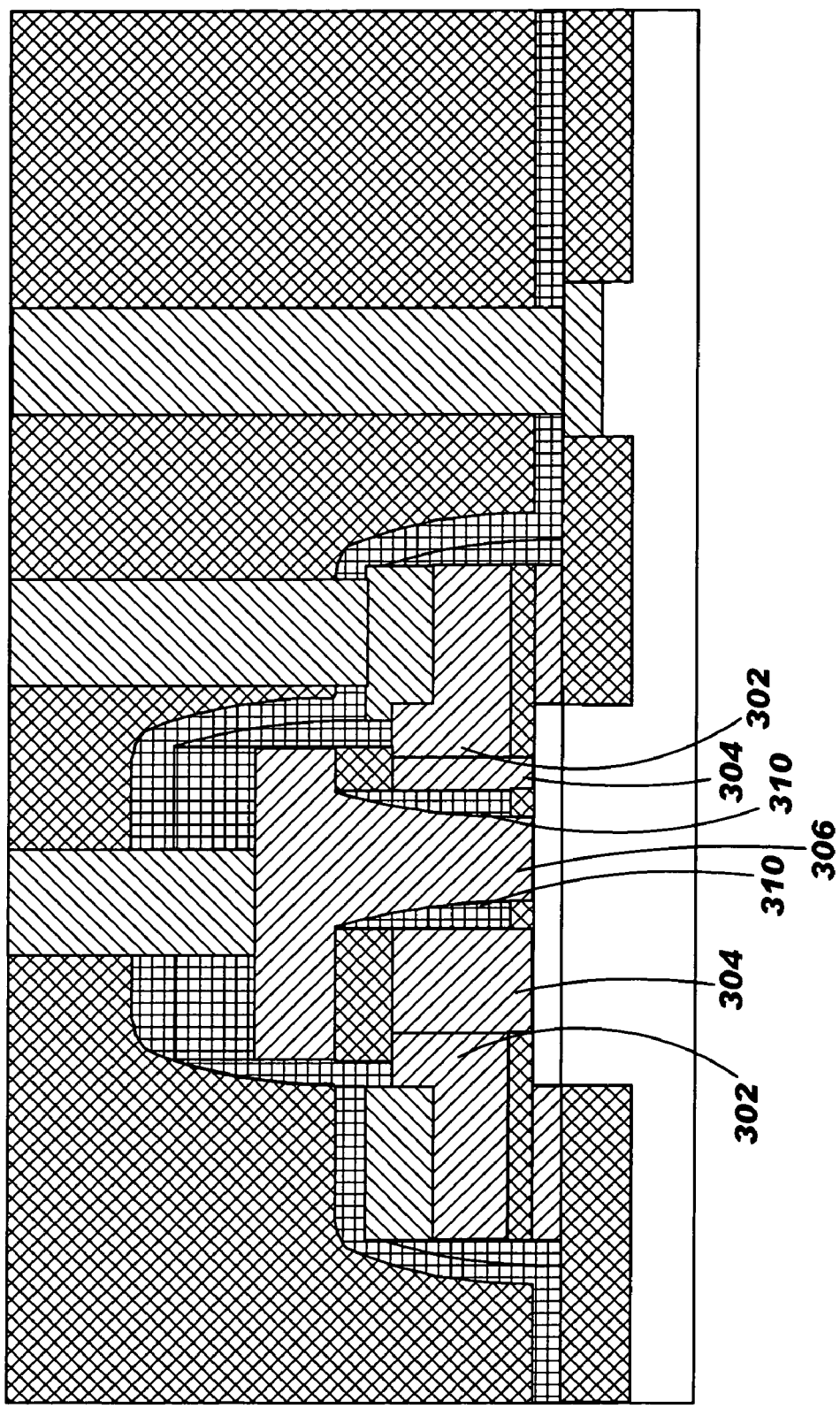

Referring to FIGS. 6A-6E, alternative steps for generating a dummy pedestal and related trench using conventional lithographic techniques is shown. These steps also illustrate an advantage of the invention. FIG. 6A shows a first opening 330 after deposition of a sacrificial layer 334, e.g., of nitride, in first opening 330. This step is similar to that shown in FIG. 3C, except that the sacrificial layer 334 is deposited to a sufficient thickness such that the first opening 330 is completely filled and a second opening is not formed. FIG. 6B shows formation of a photoresist mask 308 using conventional lithographic techniques after the sacrificial layer 334 is etched back to second dielectric layer 128 outside first opening 330. As shown, photoresist mask 308 is misaligned with first opening 330. Misalignment between photoresist 308 and first opening 330 is due to the limited alignment tolerance between the two different masks used to pattern and form first opening 330 and photoresist 308. As shown in FIG. 6B, the misaligned photoresist mask 308 is constructed to mask an area 370 that will become dummy pedestal 340 (FIG. 6C). In this case, as shown in FIG. 6C, removal of sacrificial layer 334 (FIG. 6B) outside area 370 (FIG. 6B) and within first opening 330 (FIG. 6B) forms dummy pedestal 340 and surrounding trench 342. The misalignment between dummy pedestal 340 and first opening 330 results in an asymmetric trench 342, i.e., dummy pedestal 340 and trench 342 are non-concentric. Implementing the teachings of the invention to create an inner extrinsic base extension region 304 (FIG. 6E), however, makes the misalignment moot. In other words, even though the lithographic techniques will generate a misaligned dummy pedestal (and emitter) with respect to first opening 330, as shown in FIG. 6C, deposition of second polysilicon 350 (FIG. 6D) completely fills the asymmetric trench 342 such that the overall raised extrinsic base and emitter structure are still self-aligned. In particular, as shown in FIG. 6E, the spacing between inner extrinsic base extension region 304 and an emitter 306 is determined by a spacer 310 and is not affected by the misalignment caused by lithography. In this case, however, emitter 306 is not generated at a sub-lithographic size and is limited by lithographic capabilities. Inner extrinsic base extension region 304 has a non-uniform width.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of fabricating a self-aligned bipolar transistor, the method comprising:

forming a first opening to expose a first extrinsic base region;

generating a dummy pedestal within the first opening, the dummy pedestal having a surrounding trench, the generating including:
  depositing a sacrificial layer in the first opening to form a second opening that is smaller than the first opening, the second opening defining a size of the dummy pedestal;
  depositing a filler material in the second opening; and
  removing the sacrificial layer and the filler material to generate the dummy pedestal and the trench;

forming an extrinsic base extension region in the trench, the extrinsic base extension region connecting the first extrinsic base region to an intrinsic base;

removing the dummy pedestal to form an emitter opening; and forming an emitter in the emitter opening.

2. The method of claim 1, wherein the forming the extrinsic base extension region includes providing one of silicon and polysilicon, and wherein the first extrinsic base region includes one of silicon and polysilicon having a different doping concentration than the extrinsic base extension region.

3. The method of claim 2, wherein the extrinsic base extension region has a higher doping concentration than the first polysilicon.

4. The method of claim 1, wherein the emitter forming includes:
  forming a spacer on a sidewall of the emitter opening; and
  depositing a third polysilicon in the emitter opening to form the emitter.

5. The method of claim 1, further comprising the following prior to the forming the first opening:
  depositing a first dielectric layer;
  depositing the first polysilicon over the first dielectric layer; and
  depositing a second dielectric layer over the first polysilicon,
  wherein the first opening is formed to the first dielectric layer.

6. The method of claim 5, wherein the emitter forming further includes removing the first dielectric layer within the first opening.

7. The method of claim 5, further comprising forming a cap for the extrinsic base extension region in the second dielectric layer.

8. The method of claim 5, fun her comprising thermally growing a thermal oxide layer prior to depositing the first dielectric layer;
  wherein the surrounding trench is formed to the thermal oxide layer;
  etching the first dielectric layer to form a ledge under the first extrinsic base region; and
  etching the thermal oxide layer to enlarge the ledge and extend the surrounding trench to the intrinsic base.

9. The method of claim 1, wherein the mask and the first opening are misaligned.

10. A method of fabricating a self-aligned bipolar transistor, the method comprising:
  forming a first opening, using lithography, to expose an outer extrinsic base region;
  depositing a sacrificial layer in the first opening;
  forming, using lithography misaligned with the first opening, a dummy pedestal in the sacrificial layer with a surrounding trench in the first opening;
  forming one of silicon and polysilicon in the trench to form an inner extrinsic base extension region connecting the outer extrinsic base region to an intrinsic base;
  removing the dummy pedestal to form an emitter opening; and
  forming an emitter in the emitter opening.

11. The method of claim 10, wherein the outer extrinsic base region has a different doping concentration than the inner extrinsic base extension region.

* * * * *

UNITED STATES PATENT AND TRADEMARK OFFICE
CERTIFICATE OF CORRECTION

PATENT NO. : 7,611,954 B2 Page 1 of 1
APPLICATION NO. : 11/150894
DATED : November 3, 2009
INVENTOR(S) : Freeman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1066 days.

Signed and Sealed this

Twelfth Day of October, 2010

David J. Kappos
*Director of the United States Patent and Trademark Office*